United States Patent [19]

Takao et al.

[11] Patent Number: 4,707,622
[45] Date of Patent: Nov. 17, 1987

[54] GAAS MESFET LOGIC BUFFERS USING ENHANCEMENT AND DEPLETION FETS

[75] Inventors: Hisoka Takao; Toshiro Sato; Seiichi Saito, all of Kawasaki; Toshinari Hayashi, Tama, all of Japan

[73] Assignee: Fujitsu Limited, Kawasaki, Japan

[21] Appl. No.: 815,061

[22] Filed: Dec. 31, 1985

[51] Int. Cl.⁴ ........................................ H03K 19/094
[52] U.S. Cl. .................................... 307/448; 307/450; 307/475; 307/581
[58] Field of Search ............... 307/446, 448, 450, 475, 307/443, 574, 581; 357/22 C

[56] References Cited

U.S. PATENT DOCUMENTS

| | | | |
|---|---|---|---|
| 3,699,408 | 10/1972 | Shinoda et al. | 357/22 C X |
| 3,912,546 | 10/1975 | Hunsperger et al. | 357/22 C X |
| 4,038,563 | 7/1977 | Zuleeg et al. | 357/22 C X |
| 4,394,589 | 7/1983 | Pham et al. | 307/450 |
| 4,400,411 | 12/1983 | Sano et al. | 307/448 |
| 4,438,351 | 3/1984 | Schuermeyer | 307/450 |
| 4,445,051 | 4/1984 | Elmasry | 307/450 X |
| 4,491,747 | 1/1985 | Shimizu | 307/450 X |
| 4,612,560 | 9/1986 | Dortu et al. | 357/22 C |

FOREIGN PATENT DOCUMENTS 0153860  4/1985  European Pat. Off.
55-111179 8/1980 Japan.

OTHER PUBLICATIONS

Rees et al., "Low-Temperature FET for Low-Power High-Speed Logic", Electronics Letters, Mar. 1977, vol. 13, No. 6, pp. 156-158.
Ikawa et al., "A 1K-Gate GaAs Gate Array", IEEE JSSC, vol. SC-19, No. 5, Oct. 1984, pp. 721-727.
Zuleeg et al., "Femtojoule High-Speed Planar GaAs E-JFET Logic", IEEE TELD, vol. Ed-25, No. 6, pp. 628-639; 6/1978.
Lehovec et al, "Analysis of GaAs FET's for Integrated Logic", IEEE TELD, vol. ED-27, No. 6, Jun. 1980, pp. 1074-1091.
IEEE Journal of Solid-State Circuits, vol. SC-16, No. 5, Oct. 1981, pp. 578-584, IEEE, New York, U.S.; C. D. Hartgring et al.: "Silicon MESFET Digital Circuit Techniques".
IBM Technical Disclosure Bulletin, voll 6, No. 9, Feb. 1964, pp. 91-93, New York, U.S.; L. W. Atwood: "Field Effect Transistor Circuits".
P. T. Greiling and M. Waldner: Future Applications and Limitations for Digital GaAs IC. Technology; pp. 74-87, Microwave Journal, Feb. 1983.
G. Nuzillat et al.: Low pinch-off voltage f.e.t. Logic (l.p.f. 1): l.s.i. orientated logic approach using quasinormally off GaAs m.e.s.f.e.t.s.; pp. 287-296, IEEE, Proc. vol. 127, PtI, No. 5, Oct. 1980.
N. Toyoda, et al.: Capability of GaAs DCFL for High speed Gate Array; pp. 602-605, IEDM 82.
Noboru Masuda et al.: Design of 1.6 K gate GaAs Gate Array; pp. 47-53; the paper of Technical Group, TG, SSD 83-63, IECE Japan.

Primary Examiner—Stanley D. Miller
Assistant Examiner—D. R. Hudspeth
Attorney, Agent, or Firm—Staas & Halsey

[57] ABSTRACT

A logic circuit includes an inverter circuit including a first enhancement type field effect transistor having a gate connected to an input, and a first depletion type transistor having a gate and a source which are directly connected to a drain of the first enhancement type field effect transistor. A source follower circuit including a second enhancement type field effect transistor having a gate is connected to a connecting point of the first enhancement type field effect transistor and the first depletion type field effect transistor. A second depletion type field effect transistor having a gate and a source which are directly connected to each other has a drain which is connected to a source of the second enhancement type field effect transistor. A first power source is connected to the drains of the first depletion type field effect transistor and the second enhancement type field effect transistor and a second power source is connected to the sources of the first enhancement type field effect transistor and the second depletion type field effect transistor. An output is formed at the connecting point of the second enhancement type field effect transistor and the second depletion type field effect type transistor.

4 Claims, 13 Drawing Figures

Fig. 9B

GAAS MESFET LOGIC BUFFERS USING ENHANCEMENT AND DEPLETION FETS

BACKGROUND OF THE INVENTION

1. Field of the Invention

The present invention relates to an improvement of a logic circuit which utilizes a field effect transistor.

2. Description of the Related Art

Various types of semiconductor logic circuits exist, and in many cases, these logic circuits are formed as an integrated circuit. Further, when a logic circuit is formed by unit logic circuits, the power dissipation of the logic circuit should be low (i.e., low power supply voltage), and the number of power sources for supplying the power should be kept as small as possible to improve the suitability of these unit logic circuits for the above integrated circuit. Further, it is required that the unit logic circuit have only a small delay, operate at a high speed, provide a high load driving ability, provide a high logic function, and provide a high margin.

A conventional circuit is formed by depletion type field effect transistors (hereinafter called D-FET transistor), and therefore, two power sources are required, and a level shift is required for the source follower circuit. Further, the power dissipation is high, the output logic function is low, and the load driving ability is not satisfactory.

SUMMARY OF THE INVENTION

An object of the present invention is to provide a logic circuit which utilizes only one power source without using a level shift.

Another object of the present invention is to provide a logic circuit which is operated with a low power dissipation and a high output logic function.

A further object of the present invention is to provide a logic circuit which has a satisfactory load driving ability.

The above-mentioned object can be achieved, according to the present invention, by forming a logic circuit which includes an inverter circuit including a first enhancement type field effect transistor having a gate the gate being connected to an input of the logic circuit, and a first depletion type transistor having a gate and a source which are directly connected to a drain of the first enhancement type field effect transistor; a source follower circuit including a second enhancement type field effect transistor having a gate which is connected to a common connecting point of the first enhancement type field effect transistor and the first depletion type field effect transistor, and a second depletion type field effect transistor having a gate and a source which are directly connected to each other, and a drain which is connected to a source of the second enhancement type field effect transistor; the drain of the drain of first depletion type field effect transistor and the drain of the second enhancement type field effect transistor are connected to a first power source, and the source of the first enhancement type field effect transistor and the source of the second depletion type field effect transistor are connected to a second power source; and an output formed at the connecting point of the second enhancement type field effect transistor and the second depletion type field effect type transistor.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
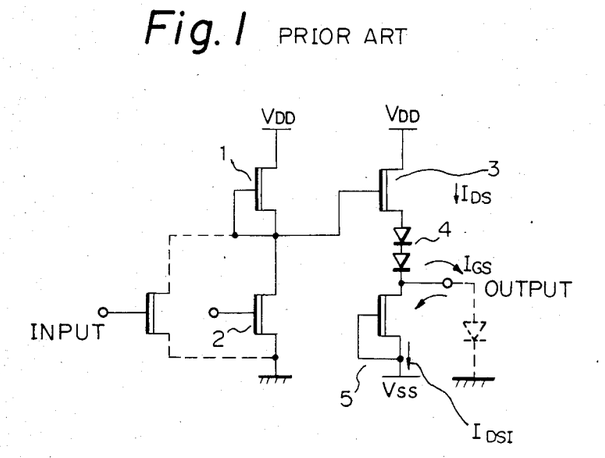
FIG. 1 shows a circuit diagram of a conventional logic circuit.

FIG. 1 shows a conventional logic circuit which uses MES field effect transistors (i.e., Schottky junction type field effect transistors). The circuit shown in FIG. 1 comprises an inverter circuit formed by a driver transistor (D-FET) 1 and a load transistor (D-FET) 2, and a source follower circuit formed by a source follower transistor 3, a level shift diode 4, and a current source using D-FET 5. Hereinafter the inverter circuit of FIG. 1 will be referred to as an inverter circuit formed by a D/D construction, and the a source follower circuit of FIG. 1 will be referred to as formed by a D/D construction.

Figure 2:
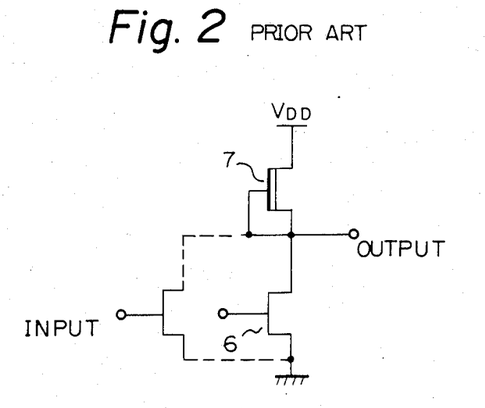
FIG. 2, FIG. 3, and FIG. 4 are circuit diagrams of other conventional logic circuits.

In the conventional circuit shown in FIG. 2, an enhancement type field effect transistor 6 (E-FET) is used as a driver transistor and a D-FET 7 is used as a load transistor. Hereinafter, this will be called an inverter circuit formed by an E/D construction.

Figure 3:
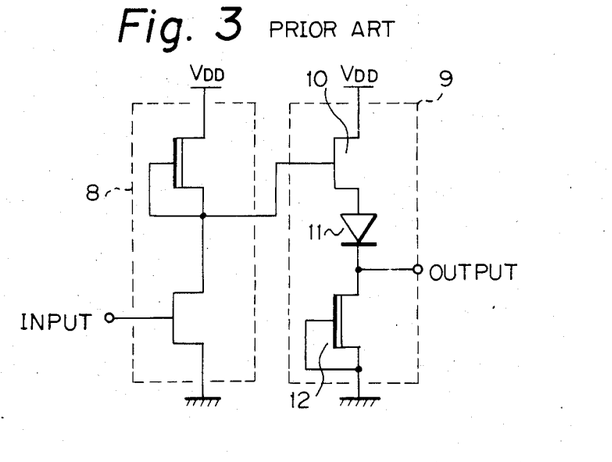

The circuit shown in FIG. 3 (disclosed in IEE PROC. Vol. 127, Pt. I, No. 5, October, 1980) is formed by an inverter circuit 8 formed by an E/D construction and a source follower circuit 9. The source follower circuit 9 uses an E-FET 10 as a source follower transistor, a level shift diode 11, and a D-FET 12. Hereinafter, the source follower circuit 9 of FIG. 3 will be called a source follower circuit formed by an E/D construction with level shift.

Figure 4:
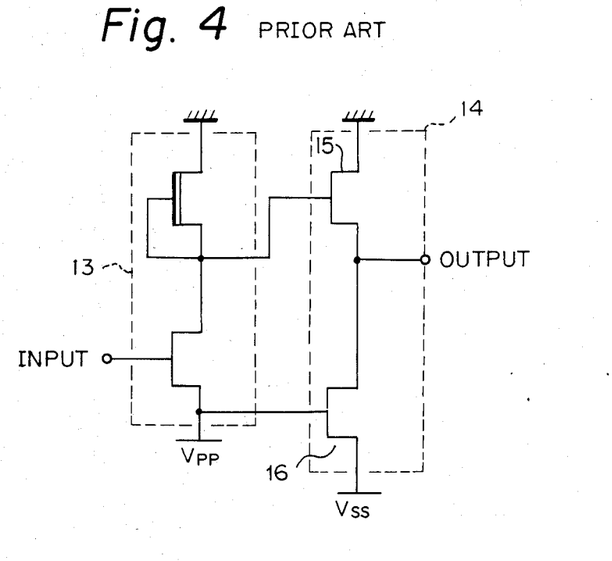

The circuit of FIG. 4, disclosed in SSD84-63 of the technical Research Report of the Institute of Electronic and Communication Engineering in Japan, comprises an inverter circuit 13 formed by an E/D construction and a source follower circuit 14 which uses an E-FET 15 as a source follower transistor, and an E-FET 16 as a current source. No level shift diode is included. Hereinafter, this will be called a source follower circuit formed by an E/E construction.

The conventional circuit shown in FIG. 1 is formed by a D-FET construction, and therefore, two power sources are required and a level shift is required for the source follower circuit. Further, the power supply voltage is high, i.e., $|V_{DD}|$ and $|V_{SS}|$ are 2 to 3 volts, and the power dissipation is high. Also, the output logic function is low. For example, although FI=8 and FO=8, the output source follower dot (hereinafter, called the output dot)≅2.

Figure 5A:
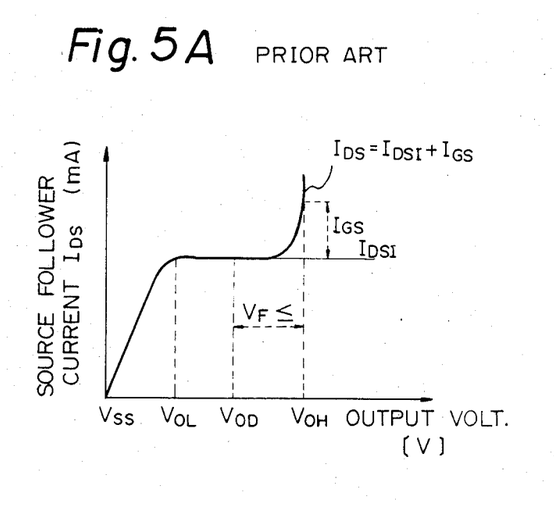
FIG. 5A is a graph showing the characteristics of the circuit shown in FIG. 1.

In addition to the above drawbacks, the driving ability for the load is not satisfactory. This is due to the following: A sufficient margin is provided for the high level ($V_{OH}$) side of the output voltage, and the operation is then carried out at the point where the diode characteristic of the Schottky diode between the gate and the source of the input FET of the gate circuit at the next stage is sufficiently clamped. Therefore, at the rising of the output, the greater part of the load driving current is dissipated as a diode current so that the load driving ability becomes limited. Further, as the source follower circuit is formed by a D/D construction with a level shift diode and the circuit is formed in such a manner that the current source is operating even in the low level ($V_{OL}$) state, the driving ability is not satisfactory at a falling time as shown in FIG. 5A. That is the current $I_{GS}$ flows into the next stage. Further, as mentioned above, the output dots cannot be increased for the following reason. When the output is at high level ($V_{OH}$), as the source follower circuit is formed by a D/D construction, the voltage $V_{GS}$ between the source and gate of the source follower transistor decreases, therefore the high level $V_{OH}$ increases, and the diode current in a next stage increases. When the output is in low level ($V_{OL}$), the low level ($V_{OL}$) rises so that the margin on the low level side decreases.

Figure 5B:
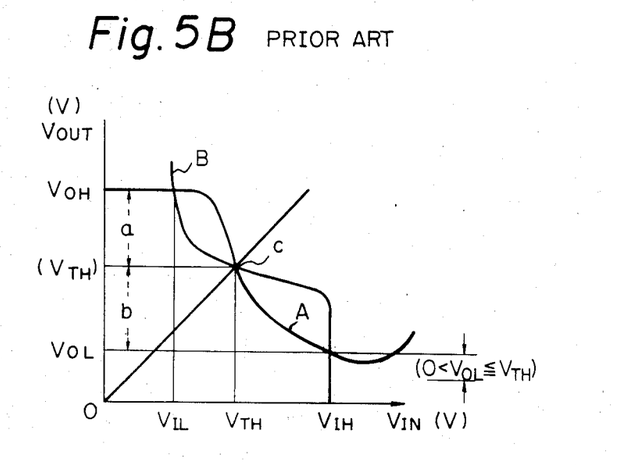
FIG. 5B is a graph showing the characteristics of the circuit shown in FIG. 2.

In the conventional circuit shown in FIG. 2, as the margin in the low level ($V_{OL}$) side is small as seen from FIG. 5B, the logic function is as low as FI<4, FO<4, and an output dot cannot be obtained because of the circuit construction. In FIG. 5B, curve A denotes an input output transmission characteristic, curve B denotes an inverted input output transmission characteristic, and point C denotes a crosspoint of the two curves A and B. Also in FIG. 5B, "a" shows an operation margin on the high level ($V_{OH}$) of side $V_{TH}$ and "b" shows an operation margin on the low level ($V_{OL}$) side of $V_{TH}$.

Further, as in the conventional circuit shown in FIG. 1, the diode current flows in the gate input of the next stage in a high level state, the power dissipation is increased and the driving ability during the time that the output level is rising is not satisfactory. When $V_{DD}$ is decreased to, e.g., $|V_{DD}|<2$ $V_F$ ($V_F$ is a forward voltage $V_{GS}$ of a Schottky diode between the source and the gate in a MES FET), the driving ability deteriorates particularly during the rising time, and the driving ability during the rising time and the falling time becomes unbalanced.

In another conventional circuit, the circuit is formed by the inverter circuit and the source follower circuit as in FIG. 1, with some of the D-FET's replaced by E-FET's. One such circuit is shown in FIG. 3, which comprises the inverter circuit 8 formed by an E/D construction and a source follower circuit 9 formed by an E/D construction with a level shift diode. The circuit shown in FIG. 4 comprises an inverter circuit 13 formed by an E/D construction and a source follower circuit 14 by E/E construction.

In these conventional circuits, as shown in FIGS. 3 and 4, E-FET's are used, so that the power source voltage can be slightly decreased, but other drawbacks cannot be resolved, as explained hereinafter.

In the circuit shown in FIG. 3, when the output is in the high level ($V_{OH}$), the diode current flows in the gate input of the next stage. Further, as the source follower circuit includes a level shift diode, the power source voltage $V_{DD}$ cannot be set to $|V_{DD}|<2$ $V_F$, and thus a voltage such as $V_{DD}\cong 3$ $V_F$ ($\cong 2.5$ volts) is required to obtain an optimum performance. Moreover, as the source follower circuit includes a level shift diode, the driving ability is deteriorated.

In the circuit shown in FIG. 4, when the output is in the high level ($V_{OH}$), the diode current flows in the gate input of the next stage, but, when the output is in the low level ($V_{OL}$), the source follower current flows. When the output dot is set, as in FIG. 1, when the output is in the low level ($V_{OL}$), the low level ($V_{OL}$) rises and decreases the margin of the low level ($V_{OL}$). Because an E-FET is used in the source follower circuit, the degree of rise of the low level ($V_{OL}$) is smaller than in the case shown in FIG. 1, however, this rise of the low level ($V_{OL}$) restricts the number of output dots.

Further, to obtain an optimum performance, a power source voltage such as 2 $V_F<|V_{SS}|\cong 2$ V is required. Thus, when the output is at high level ($V_{OH}$), the diode current flows to the next stage, and when the output is at low level ($V_{OL}$), the current flows in the source follower circuit, and accordingly, the load driving ability is unsatisfactory.

As mentioned above, in both of the conventional circuits shown in FIG. 3 and FIG. 4, there is a limit to the decrease in the power source voltage, and accordingly, there is a limit to the low power dissipation.

According to the present invention, the driver comprises an inverter circuit formed by an E/D construction, a buffer which receives the output of the inverter circuit and which comprises a source follower circuit formed by an E/D construction having no level shift diode, and the logic of the inverter circuit is output from the source follower circuit. Therefore, the load driving ability is high, the speed is high, the power dissipation is low (low source voltage), and the logic function is excellent. Therefore, the circuit can be formed using only one power source and a sufficient margin can be obtained, so that a logic circuit suitable for a high integrated circuit can be obtained.

Figure 6:
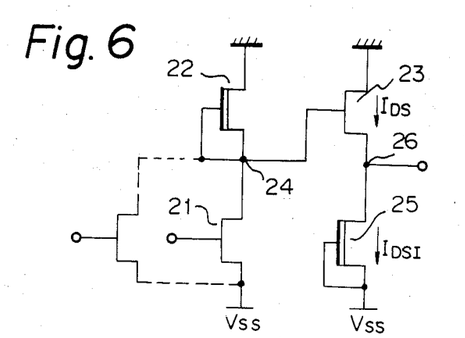
FIG. 6 is a circuit diagram of one embodiment of a logic circuit according to the present invention.

FIG. 6 shows one embodiment of the present invention. In FIG. 6, reference numeral 21 designates a first E-FET having a gate connected to an input. Reference numeral 22 designates a first D-FET having a drain and source connected to the E-FET 21. These FET's 21 and 22 form an inverter circuit. Reference numeral 23 designates a second E-FET having a gate connected to a connection point between the transistors 21 and 22, reference numeral 25 designates a second D-FET having a drain connected to a source of the E-FET 23 and a gate and a source which are connected to each other. These FET's 23 and 25 form a source follower circuit. A connection point 26 between the FET's 23 and 25 is used as an output of the whole circuit. These FET's 21, 22, 23, and 25 are MES FET's in which a threshold voltage $V_{thE}=0$–$0.3$ volt and $V_{thD}=(-1.0)$–$(-0.3)$ volts. A reference potential, for example, ground potential, is supplied to the drains of the FET's 22 and 23, and the sources of the FET's 21 and 25 are placed at $V_{SS}$ ($|V_{SS}|<2$ $V_F$, where $V_F$ is a forward voltage ($V_{GS}$) of the MES FET, and the value thereof is usually $0.7\sim 0.8$ volt in a GaAs MES FET.), that is the $V_F$ of the E-FET 21 plus the $V_F$ of the E-FET 23. For example, one power source is used to supply $-1.2$ volts. Further, the gate width of each FET and the threshold voltage $V_{th}$ are parameters for carrying out the desired operation of the present invention; in FIG. 6, these values are as follows. When the gate width of the FET 21 is $W_0$, the gate width of the FET's 22, 23, and 25 are $W_0/2$, $2W_0$ and $2W_0$, respectively, the $V_{th}$ of the FET's 21 and 23 is +0.1 volt, and the $V_{th}$ of the FET's 22 and 25 is −0.5 volt.

The values of the parameters are shown by one example in which, when the predetermined high level is supplied to the input, the voltage appearing at the output 24 of the inverter is designated as $V_{OLN}$, a threshold voltage of the transistor we forming the source follower circuit is designated as $V_{thE}$, and the power source voltage is designated as $V_{SS}$, and therefore, the following equation is satisfied:

$$V_{OLN} - V_{SS} \leq V_{thE}.$$

The whole circuit formed in the present invention functions as an inverter circuit. That is, when the high level voltage is input to the input of the FET 21, a low level voltage appears at the connection point 24, and this low level voltage is output via the source follower circuit (buffer circuit) from the connection point 26, maintaining the corresponding level in the junction 24. A similar function is carried out when the input level is inverted.

Figure 7A:
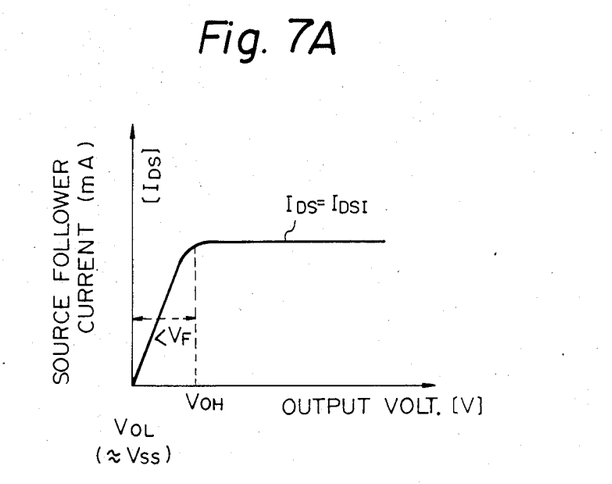
FIGS. 7A and 7B are diagrams showing the characteristics of the circuit shown in FIG. 6.

In the circuit having such a function, $|V_{SS}| < 2 V_F$, the diode characteristic in the gate input of the next stage cannot be easily clamped. Then, as shown in FIG. 7A, the driving ability at the rising time is large. Also as shown in FIG. 7A, at the falling time and the circuit is actuated in a low resistance region similarly, the driving ability becomes large. The current of the source follower circuit formed by an E/D construction, as shown in FIG. 7A, is as follows:

$I_{DS}$ in E-FET (23) = $I_{DSI}$ in D-FET (25), and the current of conventional source follower circuit formed by a D/D construction, as shown in FIG. 1 (FIG. 5A), is as follows:

$I_{DS}$ in the source follower D-FET = $I_{DSI}$ in the current source D-FET + gate current $I_{GS}$ (diode current) of the input D-FET of the next gate circuit.

In the high level $V_{OH}$, the diode current in the next gate is zero, and in the low level stage $V_{OL}$, the source follower power is zero. Thus, the power dissipation required for obtaining the same function (driving function) can be made smaller than in the conventional circuit shown in FIGS. 1 to 4.

Through the afore-mentioned feature, when the predetermined high level is supplied to the input, the output of the inverter circuit is designated $V_{OLN}$, the threshold voltage of the source follower FET is designated $V_{thE}$, and the power source voltage is designated $V_{SS}$, and thus the following equation stands:

$$V_{OLN} - V_{SS} \leq V_{thE}$$

so that the current of the source follower circuit becomes zero and $V_{OL}$ equals $V_{SS}$ when the output is at low level.

Figure 7B:
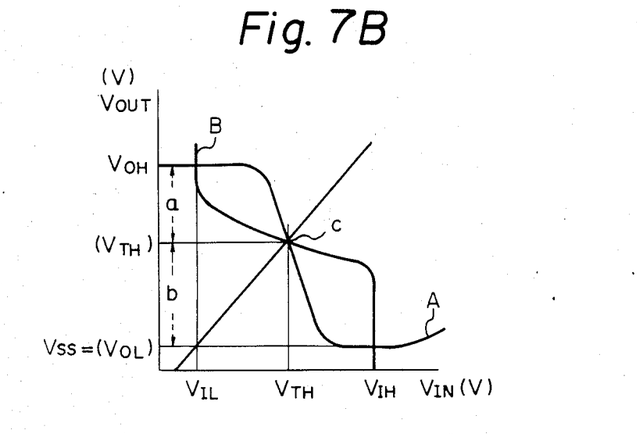

If the source follower circuit is formed as described above, the margin of the low level state ($V_{OL}$) becomes large compared to the circuit previously described. (see FIGS. 5B, 7B).

Further, if the source follower circuit formed by an E/D construction is used as the buffer and $|V_{SS}| 2 V_F$, when the output is high level at the time of dot output, the $V_{GS}$ of the source follower FET in the source follower circuit decreases. This amount is small because an E-FET is used. Further, the diode current in the next stage is small and the low level $V_{OL}$ does not rise even if the current of the source follower circuit becomes zero when the output is low level $V_{OL}$. Thus the source follower outputs more than twice as many dots than in the conventional circuit (See FIGS. 1, 4, 8A, and 8B).

Further, the ratio of delay times (including the driving ability) in the rising and the falling can be changed by changing the ratio of the gate widths of the E-FET and D-FET in the inverter circuit formed by an E/D construction and the source follower circuit formed by an E/D construction. Therefore, in the optimum design, the ratio of the delay times in the rising and the falling can be set as $\cong 1$.

Figure 9A:
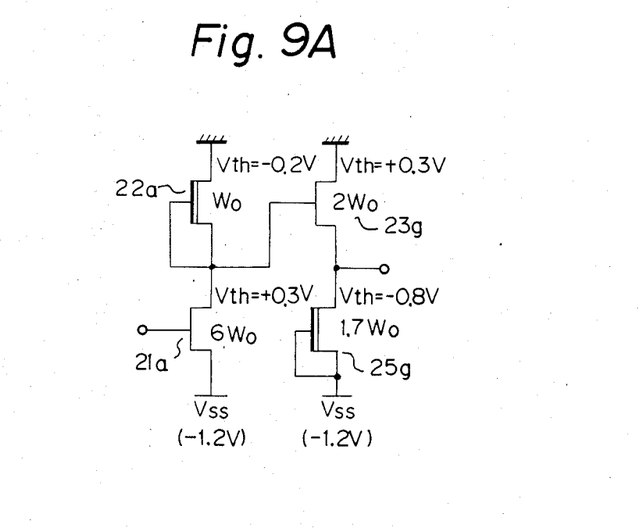
Figure 9B:
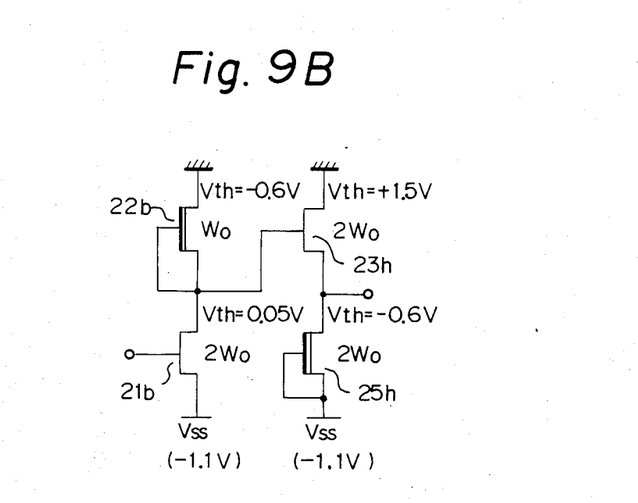

FIGS. 9A and 9B show other embodiments of the invention wherein the above parameters are changed.

The number of elements in the circuit of the present invention is smaller (no diode exists) than in the conventional circuit (FIG. 1 and FIG. 3), and therefore, it is more suitable for a high density integrated circuit. Further, in the circuit of the present invention, the inputs can be formed as an AND circuit (the number of the inputs $\cong 2$), and a plurality of source follower circuits can be connected to the inverter circuit, so that multi-source follower circuit outputs can be obtained.

Further, the field effect transistors may be Metal Insulator Semiconductor field effect transistors (MISFET's).

When the MISFET is used, a source follower circuit formed by an E/D construction without a level shift diode is connected to an inverter circuit formed by an E/D construction, and thus the following holds true:

$$(V_{OLN} - V_{SS}) \leq V_{thE}$$

as mentioned above, so that low power dissipation, high load driving ability, and many output dots can be obtained.

Figure 8A:
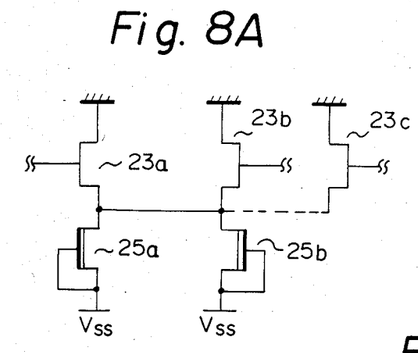
FIGS. 8A and 8B are diagrams of a logic circuit in which many source follower dots are obtained from the circuit shown in FIG. 6; and, FIGS. 9A and 9B are diagrams of modified embodiments of the logic circuit according to the present invention.
Figure 8B:
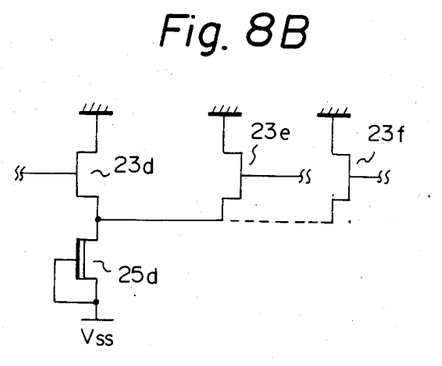

As can be understood from the above explanation, it is clear that FIG. 6 and FIGS. 8A, 8B the number of inputs of each logic circuit and the supply voltage is not defined. (In each drawing, GND can be changed to $+V_{DD}$ and $V_{SS}$ to GND.)

As mentioned above, according to the present invention, the following effects can be obtained.

1. the load driving ability can be increased and a low power dissipation can be promoted;
2. the logic function can be improved by achieving a high operation speed;
3. the circuit can be formed by one power source and a sufficient margin and sufficient output dot capability can be obtained; and,
4. the circuit is suitable for use with high density integration circuits.

What is claimed is:

1. A logic circuit, for connection to first and second power sources, comprising:
    an input;
    an inverter circuit including:
        a first enhancement type field effect transistor having a gate connected to the input and having a drain; and
        a first depletion type field effect transistor having a gate and a source which are directly connected to the drain of said first enhancement type field effect transistor at a connecting point;
    a source follower circuit including:

a second enhancement type field effect transistor having a gate which is connected to the connecting point of said first enhancement type field effect transistor and said first depletion type field effect transistor; and a second depletion type field effect transistor having a gate and a source which are directly connected to each other and having a drain which is connected to the source of said second enhancement type field effect transistor at a connecting point, the drains of said first depletion type field effect transistor and said second enhancement type field effect transistor are connected to the first power source, and the sources of said first enhancement type field effect transistor and said second depletion type field effect transistor are connected to the second power source; and an output, formed at the connecting point of said second enhancement type field effect transistor and said second depletion type field effect transistor which forms said source follower circuit.

2. A logic circuit according to claim 1, wherein the second power source supplies a voltage to the sources of the first enhancement type field effect transistor and the second depletion type field effect transistor, producing, when a predetermined high voltage level is supplied to the input, the following relationship:

$$V_{OLN} - V_{SS} \leq V_{thE},$$

where $V_{OLN}$ is the output voltage of said inverter circuit, $V_{SS}$ is the second power source voltage, and $V_{thE}$ is the threshold voltage of said second enhancement type field effect transistor.

3. A logic circuit according to claim 2, wherein said field effect transistors are MES field effect transistors, each having a gate and a source, each of said MES field effect transistors inherently having a Schottky diode coupled between its gate and its source, producing, when the first power source voltage is higher than $V_{SS}$, the following relationship:

$$V_{DD} - V_{SS} < 2 V_F,$$

where $V_{DD}$ is the first power source voltage, and $V_F$ is the forward voltage of each of said Schottky diodes.

4. A logic circuit according to claim 1 or 2, wherein said field effect transistors are MIS field effect transistors.

* * * * *

UNITED STATES PATENT AND TRADEMARK OFFICE
CERTIFICATE OF CORRECTION

PATENT NO. : 4,707,622

DATED : November 17, 1987

INVENTOR(S) : Takao et al.

Page 1 of 2

It is certified that error appears in the above-identified patent and that said Letters Patent is hereby corrected as shown below:

Front page, second column, line 3, "voll 6" should be
--Vol. 6--;

Front page, OTHER PUBLICATIONS, add --Van Tuyl et al,
"High Speed Integrated Logic with GaAs MESFETS,"
IEEE JSSC, Vol. SC-9, No. 5, Oct. 1974, pp. 269-276.--.

ABSTRACT, line 17, after "transistor" insert --,--.

Col. 1, line 44, after "gate" (first occurrence)
insert --,--.

Col. 2, line 15, change "diagrams" to --graphs--.

UNITED STATES PATENT AND TRADEMARK OFFICE
CERTIFICATE OF CORRECTION

PATENT NO. : 4,707,622

DATED : November 17, 1987

INVENTOR(S) : Takao et al.

It is certified that error appears in the above-identified patent and that said Letters Patent is hereby corrected as shown below:

Col. 3, line 18, after "That is" insert --,--.

Col. 4, line 62, change "~" to -- - --;

line 63, after "that is" insert --,--.

Col. 5, line 29, change "time and" to --time,--;

line 30, after "region" insert --and--;

line 61, delete ".";

line 64, change "$|V_{SS}|2V_F$," to --$|V_{SS}| < 2V_F$,--.

Col. 6, line 29, change "the" to --a--.

Signed and Sealed this

Nineteenth Day of July, 1988

Attest:

DONALD J. QUIGG

Attesting Officer      Commissioner of Patents and Trademarks